(12) United States Patent
Furukawa

(10) Patent No.: US 11,355,289 B2
(45) Date of Patent: Jun. 7, 2022

(54) SOLID ELECTROLYTIC CAPACITOR

(71) Applicant: Murata Manufacturing Co., Ltd., Nagaokakyo (JP)

(72) Inventor: Takeshi Furukawa, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/014,263

(22) Filed: Sep. 8, 2020

(65) Prior Publication Data

US 2020/0402723 A1 Dec. 24, 2020

Related U.S. Application Data

(63) Continuation of application No. PCT/JP2019/018874, filed on May 13, 2019.

(30) Foreign Application Priority Data

May 16, 2018 (JP) .............................. JP2018-094586

(51) Int. Cl.
| | |
|---|---|
| *H01G 9/012* | (2006.01) |
| *H01G 9/048* | (2006.01) |
| *H01G 9/10* | (2006.01) |
| *H01G 9/15* | (2006.01) |

(52) U.S. Cl.
CPC ............. *H01G 9/012* (2013.01); *H01G 9/048* (2013.01); *H01G 9/10* (2013.01); *H01G 9/15* (2013.01)

(58) Field of Classification Search
CPC ...................................................... H01G 9/012
See application file for complete search history.

(56) References Cited

U.S. PATENT DOCUMENTS

| | | | |
|---|---|---|---|
| 2019/0080849 A1* | 3/2019 | Fujii | H01G 9/055 |
| 2020/0312576 A1* | 10/2020 | Furukawa | H01G 9/14 |

FOREIGN PATENT DOCUMENTS

| | | |
|---|---|---|
| JP | 2002353073 A | 12/2002 |
| JP | 200317368 A | 1/2003 |
| JP | 2006173441 A | 6/2006 |

(Continued)

OTHER PUBLICATIONS

International Search Report issued for PCT/JP2019/018874, dated Jul. 16, 2019.

(Continued)

*Primary Examiner* — Eric W Thomas
(74) *Attorney, Agent, or Firm* — ArentFox Schiff LLP

(57) ABSTRACT

A solid electrolytic capacitor that includes: a capacitor element having a valve action metal base with a core portion, a first porous portion and a second porous portion, a first dielectric layer on the first porous portion, a first solid electrolyte layer on the first dielectric layer, a first conductor layer on the first solid electrolyte layer, a second dielectric layer on the second porous portion, and a second solid electrolyte layer on the second dielectric layer, the first dielectric layer and the first solid electrolyte layer constituting a first capacitance portion, and the second dielectric layer and the second solid electrolyte layer constituting a second capacitance portion; a cathode through electrode electrically connecting the first capacitance portion to a cathode external electrode; and a connection portion connecting the second capacitance portion to the first capacitance portion.

14 Claims, 7 Drawing Sheets

(56) References Cited

FOREIGN PATENT DOCUMENTS

| | | | |
|---|---|---|---|
| JP | 200878301 A | 4/2008 | |
| JP | 200898487 A | 4/2008 | |
| JP | 2008130722 A | 6/2008 | |
| JP | 2008135427 A | 6/2008 | |
| JP | 2009182276 A | 8/2009 | |
| JP | 2009188219 A | 8/2009 | |
| JP | 2014203850 A | 10/2014 | |
| JP | 2015043350 A * | 3/2015 | ............... H01G 9/26 |
| WO | WO-2011132467 A1 * | 10/2011 | ............... H01G 9/14 |
| WO | WO-2012042950 A1 * | 4/2012 | ............... H01G 9/15 |
| WO | WO-2013094197 A1 * | 6/2013 | ............ H01G 9/012 |
| WO | WO-2017217359 A1 * | 12/2017 | ............... H01G 9/04 |
| WO | 2018021001 A1 | 2/2018 | |
| WO | 2018066254 A1 | 4/2018 | |

OTHER PUBLICATIONS

Written Opinion of the International Searching Authority issued for PCT/JP2019/018874, dated Jul. 16, 2019.

* cited by examiner

SECTIONAL VIEW TAKEN ALONG LINE A-A

SOLID ELECTROLYTIC CAPACITOR

CROSS REFERENCE TO RELATED APPLICATIONS

The present application is a continuation of International application No. PCT/JP2019/018874, filed May 13, 2019, which claims priority to Japanese Patent Application No. 2018-094586, filed May 16, 2018, the entire contents of each of which are incorporated herein by reference.

FIELD OF THE INVENTION

The present invention relates to a solid electrolytic capacitor.

BACKGROUND OF THE INVENTION

A solid electrolytic capacitor is provided with a capacitor element including: a valve action metal base having a porous layer on a surface of a valve action metal such as aluminum; a dielectric layer on a surface of the porous layer; a solid electrolyte layer on the dielectric layer; and a conductor layer on the solid electrolyte layer.

As described in Patent Document 1, conventionally, a plurality of capacitor elements are layered. The layered capacitor elements are electrically connected to a lead frame, and then are sealed with resin by transfer molding or the like. The layered capacitor elements may be electrically connected to a mounting board such as a printed board instead of the lead frame, and then may be sealed with resin.

Patent Document 1: Japanese Patent Application Laid-Open No. 2008-135427

SUMMARY OF THE INVENTION

Unfortunately, the capacitor elements described in Patent Document 1 are each a two-terminal type provided at both ends with respective external electrodes each formed of a lead frame. This causes poor volume efficiency and a small ratio of occupation of a portion that generates capacitance (hereinafter referred to as a capacitance portion), so that required capacitance is difficult to obtain.

The present invention is made to solve the above problems, and it is an object of the present invention to provide a solid electrolytic capacitor that can efficiently obtain capacitance and can be designed to be thin.

A solid electrolytic capacitor of the present invention includes: a capacitor element having a valve action metal base with a core portion having a first principal surface and a second principal surface, a first porous portion on the first principal surface and a second porous portion on the second principal surface, a first dielectric layer on the first porous portion, a first solid electrolyte layer on the first dielectric layer, a first conductor layer on the first solid electrolyte layer, a second dielectric layer on the second porous portion, and a second solid electrolyte layer on the second dielectric layer, the first dielectric layer and the first solid electrolyte layer forming a first capacitance portion at a principal surface of the solid electrolytic capacitor, and the second dielectric layer and the second solid electrolyte layer forming a second capacitance portion; a cathode external electrode electrically connected to the first conductor layer; an anode external electrode electrically connected to the core portion; a cathode through electrode electrically connecting the first capacitance portion to the cathode external electrode; and a connection portion passing through at least a part of the solid electrolytic capacitor in a thickness direction thereof so as to extend the second capacitance portion to the principal surface of the solid electrolytic capacitor, having the first capacitance portion.

The present invention enables providing a solid electrolytic capacitor that can efficiently obtain capacitance and can be designed to be thin.

DETAILED DESCRIPTION OF THE INVENTION

Figure 1:
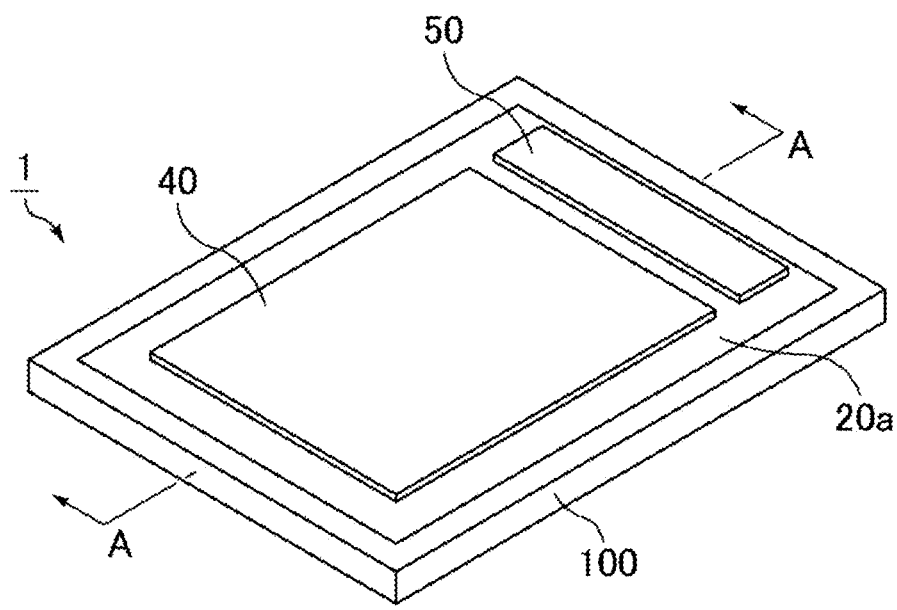
FIG. 1 is a perspective view schematically illustrating an example of a solid electrolytic capacitor according to a first embodiment of the present invention.

Hereinafter, a solid electrolytic capacitor of the present invention will be described.

However, the present invention is not limited to the following structure, and can be appropriately modified and applied without changing the gist of the present invention. The present invention also includes a combination of two or more individual desirable structures of the present invention described below.

Each embodiment is exemplified below, and it is needless to say that structure shown in different embodiments can be partly replaced or combined. In the second and subsequent embodiments, description of matters common to the first embodiment will be eliminated, and only different points will be described. In particular, a similar effect by a similar structure will not be sequentially referred to for each embodiment.

Hereinafter, when each embodiment is not distinguished, a solid electrolytic capacitor of each embodiment is simply referred to as the "solid electrolytic capacitor of the present invention".

Additionally, each embodiment is described as follows: when the first porous portion and the second porous portion are not distinguished, they are each simply referred to as a "porous portion"; when the first dielectric layer and the second dielectric layer are not distinguished, they are each simply a "dielectric layer"; when the first solid electrolyte layer and the second solid electrolyte layer are not distinguished, they are each simply referred to as a "solid electrolyte layer"; when the first conductor layer and a second conductor layer are not distinguished, they are each simply referred to as a "conductor layer"; when a first sealing layer and a second sealing layer are not distinguished, they are each simply referred to as a "sealing layer"; and when a first insulating layer and a second insulating layer are not distinguished, they are each simply referred to as a "insulating layer".

First Embodiment

A solid electrolytic capacitor according to a first embodiment of the present invention includes: a capacitor element having a valve action metal base with a core portion having a first principal surface and a second principal surface, a first porous portion on the first principal surface and a second porous portion on the second principal surface, a first dielectric layer on the first porous portion, a first solid electrolyte layer on the first dielectric layer, a first conductor layer on the first solid electrolyte layer, a second dielectric layer on the second porous portion, and a second solid electrolyte layer on the second dielectric layer, the first dielectric layer and the first solid electrolyte layer forming a first capacitance portion at a principal surface of the solid electrolytic capacitor, and the second dielectric layer and the second solid electrolyte layer forming a second capacitance portion; a cathode external electrode electrically connected to the first conductor layer; an anode external electrode electrically connected to the core portion; a cathode through electrode electrically connecting the first capacitance portion to the cathode external electrode; and a connection portion passing through at least a part of the solid electrolytic capacitor in a thickness direction thereof so as to extend the second capacitance portion to the principal surface of the solid electrolytic capacitor, having the first capacitance portion.

With the above structure, capacitance can be generated on both sides of the valve action metal base, so that the capacitance can be efficiently obtained as compared with a conventional solid electrolytic capacitor.

Additionally, the second capacitance portion is extended to the principal surface of the solid electrolytic capacitor having the first capacitance portion, using the connection portion, so that an external electrode for connecting the second capacitance portion to the outside is not required to be provided on a surface opposite to a surface on which the cathode external electrode is formed. This enables the solid electrolytic capacitor to be designed to be thin.

FIG. 1 is a perspective view schematically illustrating an example of the solid electrolytic capacitor according to the first embodiment of the present invention.

FIG. 1 illustrates a solid electrolytic capacitor 1 that includes a first sealing layer 20a and a second sealing layer (not illustrated), for sealing first and second main surfaces of a capacitor element (not illustrated), respectively, and an exterior resin 100 covering a side surface of the capacitor element, and that includes a cathode external electrode 40 and an anode external electrode 50.

Figure 2:
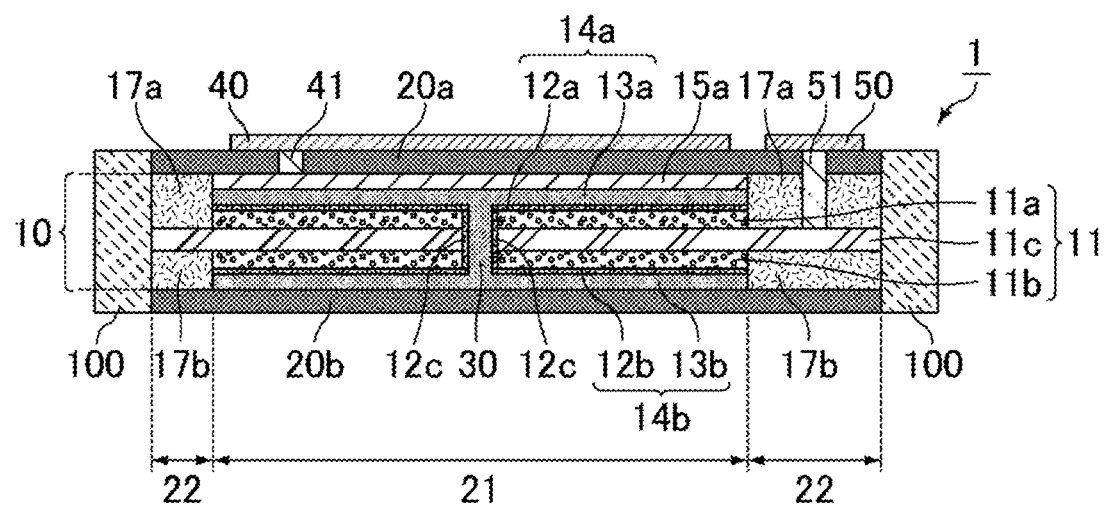
FIG. 2 is a sectional view of the solid electrolytic capacitor illustrated in FIG. 1, taken along line A-A.

FIG. 2 is a sectional view of the solid electrolytic capacitor illustrated in FIG. 1, taken along line A-A.

As illustrated in FIG. 2, a capacitor element 10 includes a valve action metal base 11 having a first porous portion 11a on a first principal surface of a core portion 11c and a second porous portion 11b on a second principal surface thereof, a first dielectric layer 12a on the first porous portion 11a, a first solid electrolyte layer 13a on the first dielectric layer 12a, a first conductor layer 15a on the first solid electrolyte layer 13a, a second dielectric layer 12b on the second porous portion 11b, and a second solid electrolyte layer 13b on the second dielectric layer 12b.

The core portion 11c has the first principal surface with a region where a first insulating layer 17a is provided instead of the first porous portion 11a, and the second principal surface with a region where a second insulating layer 17b is provided instead of the second porous portion 11b. Capacitance is generated at a boundary between a dielectric layer and a solid electrolyte layer, so that the first dielectric layer 12a and the first solid electrolyte layer 13a are collectively referred to as a first capacitance portion 14a, and the second dielectric layer 12b and the second solid electrolyte layer 13b are collectively referred to as a second capacitance portion 14b.

The first sealing layer 20a is further disposed on the first conductor layer 15a. A second sealing layer 20b is further disposed on the second solid electrolyte layer 13b. The cathode external electrode 40 and the anode external electrode 50 are provided on the first sealing layer 20a.

The cathode external electrode 40 is electrically connected to the first conductor layer 15a through a cathode through electrode 41 passing through the first sealing layer 20a.

The anode external electrode 50 is electrically connected to the core portion 11c through an anode through electrode 51 passing through the first insulating layer 17a.

The first insulating layer 17a provided between an exposed portion of the core portion 11c and the first sealing layer 20a, and the second insulating layer 17b provided between the exposed portion of the core portion 11c and the second sealing layer 20b, insulate an anode portion 22 and a cathode portion 21.

The capacitor element 10 is further provided with a connection portion 30 for drawing out the second capacitance portion 14b to the principal surface with the first capacitance portion 14a. More specifically, the connection portion 30 passes through the first dielectric layer 12a, the first porous portion 11a, the core portion 11c, the second porous portion 11b, and the second dielectric layer 12b in their thickness directions to electrically connect the first solid electrolyte layer 13a and the second solid electrolyte layer 13b.

Although the solid electrolytic capacitor 1 illustrated in FIG. 2 includes the connection portion 30 that passes through the first dielectric layer 12a, the first porous portion 11a, the core portion 11c, the second porous portion 11b, and the second dielectric layer 12b in their thickness directions to electrically connect the first solid electrolyte layer 13a and the second solid electrolyte layer 13b, the connection portion 30 may further pass through the first solid electrolyte layer 13a and the first sealing layer 20a. Although this case allows the second solid electrolyte layer 13b and the cathode external electrode 40 to be connected by the connection portion, it can be said that even this case allows the second solid electrolyte layer 13b and the first solid electrolyte layer 13a to be electrically connected by the connection portion 30.

In any case, the second solid electrolyte layer 13b is electrically connected to the first solid electrolyte layer 13a, so that the second capacitance portion 14b can be extended to the principal surface having the first capacitance portion 14a.

That is, when the connection portion is provided at a position where the first solid electrolyte layer, the core portion, and the second solid electrolyte layer overlap each other in top view, the connection portion preferably passes through at least the first dielectric layer, the first porous portion, the core portion, the second porous portion, and the second dielectric layer in their thickness directions to electrically connect the first solid electrolyte layer and the second solid electrolyte layer.

Here, the porous portion and the core portion, constituting the valve action metal base, are each a conductor, and thus a short circuit occurs when they come into direct contact with the connection portion. Thus, insulation is required at least between the core portion and the connection portion and between the porous portion and the connection portion.

Examples of a method for insulating the valve action metal base from the connection portion include a method using a dielectric layer and a method using an insulating film made of an insulating resin. FIG. 2 illustrates a case of using a dielectric layer.

The connection portion 30 is made of the same conductive polymer as the first solid electrolyte layer 13a and the second solid electrolyte layer 13b, and the valve action metal base 11 has a surface that faces the connection portion 30 and that is provided with a third dielectric layer 12c. The third dielectric layer 12c prevents the valve action metal base 11 and the connection portion 30 from being short-circuited. The connection portion made of another material will be described later.

The solid electrolytic capacitor 1 illustrated in FIG. 2 includes the first sealing layer 20a, the second sealing layer 20b, and the exterior resin 100, which are not essential components.

When the capacitor element 10 is viewed from top, the first capacitance portion 14a and the second capacitance portion 14b are not particularly limited in size and size relationship. Thus, the first capacitance portion 14a and the second capacitance portion 14b may be different is size, or the first capacitance portion 14a and the second capacitance portion 14b may be identical in size.

A second conductor layer may be further formed on the second solid electrolyte layer.

When the connection portion is connected to the second solid electrolyte layer, capacitance generated in the second capacitance portion is extended to the principal surface having the first capacitance portion through the connection portion. Thus, there is no problem even when the second conductor layer is not provided. In contrast, when the connection portion is not connected to the second solid electrolyte layer, e.g., when the connection portion is connected to a back-surface extraction electrode layer, capacitance generated in the second capacitance portion is initially supplied to a back surface through the back-surface extraction electrode layer. Then, the capacitance can be further supplied to the principal surface with the first capacitance portion through the connection portion. At this time, when the second conductor layer is formed on the second solid electrolyte layer, the second capacitance portion and the back-surface extraction electrode layer have a good electrical contact therebetween.

The cathode through electrode 41 is not particularly limited in form, and may be a plating electrode, a paste electrode, or the like. The plating electrode means an electrode made of a plating film such as an electrolytic plating film or an electroless plating film. The paste electrode means an electrode made of a cured product of a conductive paste, and specifically means an electrode made of a conducting particle and a thermosetting resin.

The cathode through electrode 41 may be a metal pin in a columnar shape. When the cathode through electrode 41 is a metal pin, the cathode through electrode 41 preferably has a cross-sectional shape in a rectangular shape having an area on a cathode external electrode 40 side that is substantially equal to an area on a first conductor layer 15a side. Examples of the shape of the metal pin include a cylindrical columnar shape. The shape of the cathode through electrode is not limited to a columnar shape such as a cylindrical columnar shape, and may be a wall shape. This case enables increasing an extended area as compared to a case where the cathode through electrode is formed only in a columnar shape, and thus equivalent series resistance (ESR) can be further reduced.

Although one cathode through electrode 41 is formed in FIG. 2, more than one cathode through electrode 41 may be formed.

The cathode external electrode 40 is not particularly limited in form, and examples thereof include a metal electrode and a paste electrode. The metal electrode means an electrode made of a metal film. Examples of the metal film include a plating film, a sputtered film, a vapor deposition film, and the like.

When the cathode external electrode 40 is a metal electrode, the anode external electrode 50 is also preferably a metal electrode, but may be a paste electrode. Similarly, when the cathode external electrode 40 is a paste electrode, the anode external electrode 50 is also preferably a paste electrode, but may be a metal electrode. The plating film can be expected to be reduced in resistance by directly growing on a metal surface of the through electrode. The paste electrode can be expected to be improved in reliability by improving adhesion strength to the through electrode.

Although the cathode external electrode 40 is not particularly limited is shape, the cathode external electrode 40 is preferably configured to cover the cathode through electrode 41 when viewed from the normal direction of a first principal surface of the capacitor element 10, and to have an area larger than an area of the cathode through electrode 41 extended to a front surface of the first sealing layer 20a.

The cathode external electrode 40 may be a terminal in the shape of a ball, provided on the cathode through electrode 41. Examples of the terminal in the shape of a ball include a ball grid array (BGA) terminal and the like.

The anode external electrode 50 is electrically connected to a core portion 11c. The solid electrolytic capacitor 1 illustrated in FIG. 2 includes the first insulating layer 17a, the first sealing layer 20a, and the anode external electrode 50, which are provided in this order on the core portion 11c where the first porous portion 11a is not provided, and includes the anode through electrode 51 passing through the first insulating layer 17a and the first sealing layer 20a.

However, the anode external electrode 50 may be disposed on the first insulating layer 17a instead of the first sealing layer 20a. In this case, the first insulating layer 17a and the anode external electrode 50 are provided in this order on the core portion 11c where the first porous portion 11a is not provided, and the anode through electrode 51 passing through the first insulating layer 17a is provided.

The anode through electrode 51 is not particularly limited in form, and examples thereof include a plating electrode and a paste electrode.

The anode through electrode 51 may be a metal pin in a columnar shape. When the anode through electrode 51 is a metal pin in a columnar shape, the anode through electrode 51 preferably has a cross-sectional shape in a rectangular shape having an area on an anode external electrode 50 side that is substantially equal to an area on a core portion 11c side. Examples of the shape of the metal pin include a cylindrical columnar shape. The shape of the anode through electrode is not limited to a columnar shape such as a cylindrical columnar shape, and may be a wall shape.

The anode external electrode 50 is not particularly limited in form, and examples thereof include a metal electrode and a paste electrode.

Although the anode external electrode 50 is not particularly limited is shape, the anode external electrode 50 is preferably configured to cover the anode through electrode 51 when viewed from the normal direction of the first principal surface of the capacitor element 10, and to have an area larger than an area of the anode through electrode 51 extended to a front surface of the first insulating layer 17a or the first sealing layer 20a.

The anode external electrode 50 may be a terminal in the shape of a ball, provided on the anode through electrode 51. Examples of the terminal in the shape of a ball include a ball grid array (BGA) terminal and the like.

FIG. 2 illustrates the cathode external electrode 40 and the anode external electrode 50 that are not in contact with each other and are insulated on the front surface of the first sealing layer 20a.

Although not illustrated in FIG. 2, for example, a surface other than the surface including the anode external electrode 50 and the cathode external electrode 40 may be covered with another insulating layer from a viewpoint of protecting other surfaces. From a viewpoint of protecting a capacitor element, for example, a stress relaxation layer, a moisture-proof film, or the like may be provided between the capacitor element and a sealing layer.

In the solid electrolytic capacitor of the present invention, the number of connection portions is not limited to one, and two or more connection portions may be formed.

The electrolytic capacitor of the present invention includes the first sealing layer and the cathode external electrode, provided on the first conductor layer, the cathode through electrode provided in the first sealing layer, and the first dielectric layer and the first solid electrolyte layer, constituting the first capacitance portion that is extended to the front surface of the first sealing layer through the cathode through electrode. The second capacitance portion including the second dielectric layer and the second solid electrolyte layer is also extended to the principal surface with the first capacitance portion through the connection portion. Thus, a ratio of a volume of a capacitance generation portion to the entire volume of the capacitor can be increased by minimizing each functional layer other than the capacitance portion (a portion contributing to capacitance) while concentrating functions on only one side of the valve action metal base. As a result, the capacitance can be efficiently obtained, and the solid electrolytic capacitor can be designed to be thin.

Although the solid electrolytic capacitor is not particularly limited in thickness, it preferably has a thickness of 0.1 mm or more and 0.8 mm or less, and more preferably has a thickness of 0.15 mm or more and 0.3 mm or less.

The capacitance is preferably 1.0 µF or more.

The solid electrolytic capacitor of the present invention includes the valve action metal base that is made of a valve action metal exhibiting so-called valve action. Examples of the valve action metal include simple metals such as aluminum, tantalum, niobium, titanium and zirconium, and alloys containing these metals. Among these metals, aluminum or aluminum alloy is preferable.

The valve action metal base preferably has a plate-like shape, and more preferably has a foil-like shape. The valve action metal base includes a core portion provided on both sides with respective porous portions. The porous portions are preferably etching layers formed on respective surfaces of the core portion. After the porous portions are formed on the respective surfaces of the core portion by etching, an exposed portion having no porous portion can be formed on each of the surfaces of the core portion by a method for removing the porous portion using laser irradiation or the like.

The core portion of the valve action metal base preferably has a thickness of 5 µm or more and 100 µm or less, and the porous portion on one side excluding the core portion preferably has a thickness of 5 µm or more and 200 µm or less.

The solid electrolytic capacitor of the present invention includes the dielectric layer that is formed on a surface of each of the porous portions of the valve action metal base. The dielectric layer formed on the surface of each of the porous portions reflects a surface state of each of the porous portions, and has a fine uneven surface shape. The dielectric layer is preferably composed of an oxide film of the valve action metal. When aluminum foil is used as the valve action metal base, for example, the dielectric layer composed of an oxide film can be formed by performing anodizing (also called chemical conversion treatment) on a surface of the aluminum foil in an aqueous solution containing ammonium adipate and the like. The dielectric layer is preferably not formed on each of the surfaces of the core portion.

In the solid electrolytic capacitor of the present invention, examples of the material constituting the solid electrolyte layer include conductive polymers such as polypyrroles, polythiophenes, and polyanilines. Among these materials, polythiophenes are preferable, and poly (3,4-ethylenedioxythiophene) called PEDOT is particularly preferable. The conductive polymers each may contain a dopant such as polystyrene sulfonic acid (PSS). The solid electrolyte layer preferably includes an inner layer that fills pores of the dielectric layer and an outer layer with which the dielectric layer is covered.

Although the electrolytic capacitor of the present invention is not particularly limited in material constituting the conductor layer, the material preferably includes metal foil.

When the conductor layer includes the metal foil having a small surface resistance, an extended distance from the conductor layer provided in the cathode portion to the cathode external electrode can be shortened, and ESR and equivalent series inductance (ESL) can be designed low.

Using the metal foil as the conductor layer enables the cathode through electrode to be formed by plating after a through-hole is formed in the sealing layer. Thus, the cathode through electrode can be reduced in ESR.

Examples of the metal used for plating include Cu and Ni.

Although the metal foil is not particularly limited in thickness, it preferably have a thickness of 5 µm or more and 100 µm or less from a viewpoint of reducing ESR.

The metal foil is preferably made of at least one kind of metal selected from a group composed of aluminum, copper, silver, and alloys containing any of these metals as a main component.

The metal foil may have a surface coated with carbon.

The solid electrolytic capacitor of the present invention includes the insulating layer that is preferably made of resin. Examples of the resin constituting the insulating layer include polyphenyl sulfone resin, polyether sulfone resin, cyanate ester resin, fluororesin such as tetrafluoroethylene and tetrafluoroethylene/perfluoroalkyl vinyl ether copolymer, polyimide resin, polyamide-imide resin, and insulating resins such as derivatives or precursors of the resins above. The insulating layer may be made of the same resin as the sealing layer.

The solid electrolytic capacitor of the present invention includes the sealing layer that is preferably made of resin. Examples of the resin constituting the sealing layer include epoxy resin, phenol resin, and the like.

Although the solid electrolytic capacitor of the present invention is not particularly limited in material constituting the connection portion as long as the material has conductivity, examples of the material include a conductive polymer, a conductive adhesive, a plated metal, a metal pin, an electrode paste, and the like.

The connection portion passing through the valve action metal base will be described.

When the connection portion passing through the valve action metal base is made of a conductive polymer, the valve action metal base and the connection portion are preferably insulated by the dielectric layer (also called the third dielectric layer) formed by applying chemical conversion treatment to the valve action metal base.

When the connection portion passing through the valve action metal base is made of a conductive polymer, and the third dielectric layer is provided between the core portion and the connection portion and between the porous portion and the connection portion, capacitance is generated between the third dielectric layer and the conductive polymer constituting the connection portion. This is preferable because the capacitance per volume can be increased.

When the connection portion passing through the valve action metal base is made of a conductive adhesive, a metal pin, or a plated conductor, a surface of the valve action metal base is preferably insulated from the connection portion by the insulating resin.

The connection portion made of a conductive adhesive, a metal pin, or a plated conductor will be described with reference to FIG. 3.

Figure 3:
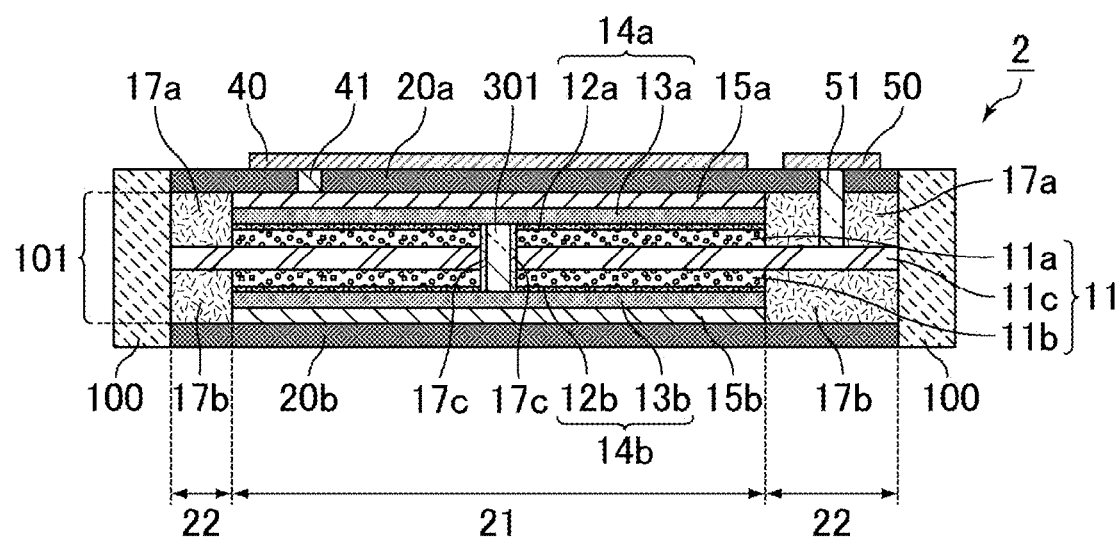
FIG. 3 is a sectional view schematically illustrating another example of the solid electrolytic capacitor according to the first embodiment of the present invention.

FIG. 3 is a sectional view schematically illustrating another example of the solid electrolytic capacitor according to the first embodiment of the present invention.

FIG. 3 illustrates a solid electrolytic capacitor 2 including a connection portion 301 that passes through a capacitor element 101 from its first surface to second surface, and that is made of a material having relatively higher conductivity than the conductive polymer described above, such as a conductive adhesive, a metal pin, or a plated conductor. In this case, insulation between the core portion 11c and the connection portion 301 may be insufficient in the third dielectric layer 12c illustrated in FIG. 2. Thus, when the insulation is insufficient, a valve action metal base 11 (the core portion 11c, the first porous portion 11a, and the second porous portion 11b) has a surface that faces the connection portion 301 and that is preferably insulated by an insulating film 17c made of an insulating resin, as illustrated in FIG. 3.

The connection portion is not particularly limited in shape, and may be in a cylindrical columnar shape or a bent shape. The bent shape has two openings that are displaced from each other in top view. Specifically, for example, the bent shape has a first non-through-hole provided from a first surface toward a second surface, and a second non-through-hole provided from the second surface toward the first surface, which partly overlap each other in top view, and a total of a depth of the first non-through-hole and a depth of the second non-through-hole having depth, being longer than a length from the first surface to the second surface, and thus the bent shape is formed by connecting the first non-through-hole and the second non-through-hole.

When the connection portion has a bent shape, the connection portion can be increased in surface area as compared to a non-bent shape in which openings are not displaced from each other in top view, and thus reduction in electric resistance and improvement in close contact with the connection portion can be expected. The two openings are displaced from each other in top view, so that the connection portion can be prevented from falling off.

The connection portion in a bent shape will be described with reference to FIG. 4.

Figure 4:
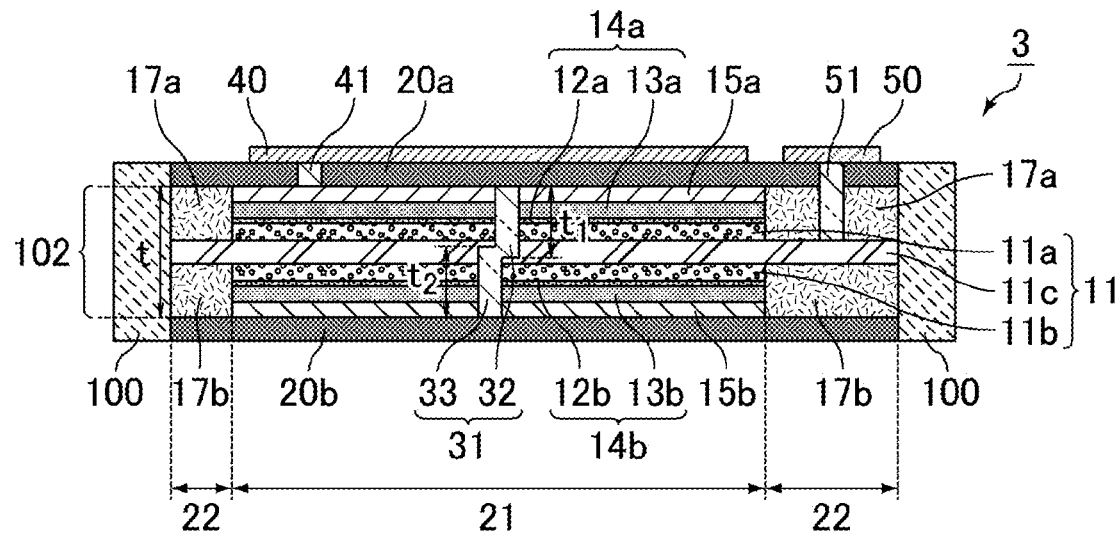
FIG. 4 is a sectional view schematically illustrating yet another example of the solid electrolytic capacitor according to the first embodiment of the present invention.

FIG. 4 is a sectional view schematically illustrating yet another example of the solid electrolytic capacitor according to the first embodiment of the present invention.

FIG. 4 illustrated a solid electrolytic capacitor 3 including a connection portion 31 that passes through a capacitor element 102 from its first surface to second surface. The connection portion 31 has a shape that has a first non-through hole 32 provided from the first surface toward the second surface, and a second non-through hole 33 provided from the second surface toward the first surface, which partly overlap each other in top view, and that has a total of a depth of the first non-through-hole 32 (a length indicated by a double-headed arrow t1 in FIG. 4) and a depth of the second non-through-hole 33 (a length indicated by a double-headed arrow t2 in FIG. 4), being longer than a length of the capacitor element 102 from its first principal surface to second surface (a length indicated by a double-headed arrow t in FIG. 4) (t1+t2>t), the shape being formed by connecting the first non-through hole 32 and the second non-through hole 33. The shape also has two openings (an opening where the first non-through hole 32 is opened in the first conductor layer 15a, and an opening where the second non-through hole 33 is opened in the second conductor layer 15b) that are displaced from each other in top view.

Although not illustrated, the connection portion 31 and the valve action metal base 11 are insulated.

When the connection portion 31 illustrated in FIG. 4 is made of a material having a relatively higher conductivity than the above-mentioned conductive polymer, such as a conductive adhesive, a metal pin, or a plated conductor, the valve action metal base 11 (the core portion 11c, the first porous portion 11a, and the second porous portion 11b) has a surface that faces the connection portion 31 and that is preferably insulated by an insulating film made of an insulating resin.

In contrast, when the connection portion 31 is made of a conductive polymer, the surface of the valve action metal base 11 facing the connection portion 31 is preferably provided with the third dielectric layer obtained by applying chemical conversion treatment to the valve action metal base 11.

The solid electrolytic capacitor of the present invention that includes the connection portion that may be configured to allow the second capacitance portion to be extended to a principal surface with the first capacitance portion. Thus, the connection portion 31 illustrated in FIG. 4 may not pass through the first conductor layer 15a, the first solid electrolyte layer 13a, the second solid electrolyte layer 13b, and the second conductor layer 15b, and may pass through only the first dielectric layer 12a, the first porous portion 11a, the core portion 11c, the second porous portion 11b, and the second dielectric layer 12b, for example.

The solid electrolytic capacitor of the present invention is not particularly limited in a position where the connection portion is provided.

Figure 5:
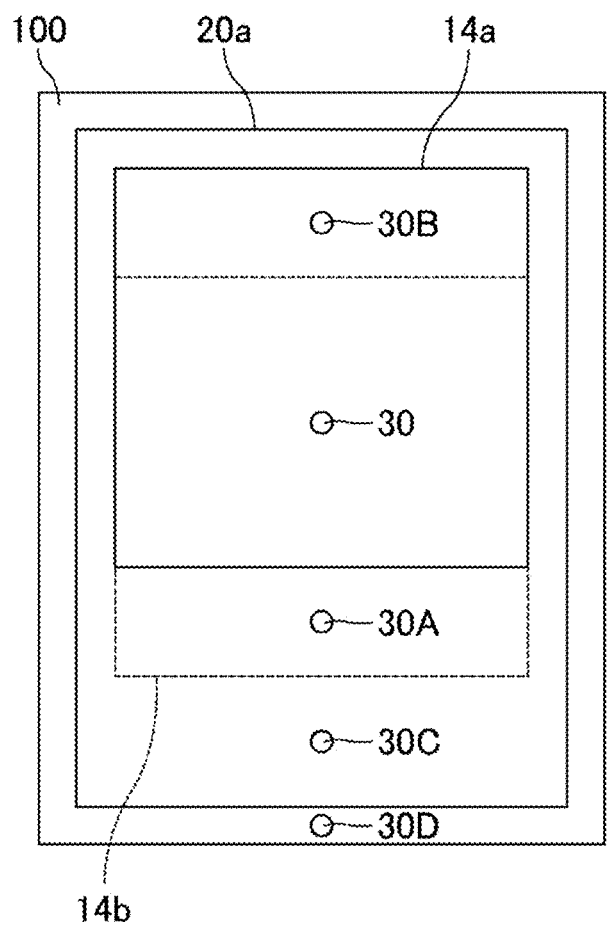
FIG. 5 is a top view schematically illustrating a region where a connection portion is provided in a solid electrolytic capacitor of the present invention.

FIG. 5 is a top view schematically illustrating a region where the connection portion is provided in the solid electrolytic capacitor of the present invention. In FIG. 5, a cathode external electrode and an anode external electrode are eliminated.

FIG. 5 illustrates the solid electrolytic capacitor in which a region occupied by each of the exterior resin 100, the first sealing layer 20a, the first capacitance portion 14a, and the second capacitance portion 14b, positions where respective connection portion 30, 30A, 30B, 30C, and 30D are formed, are schematically illustrated. Although not illustrated, the core portion 11c is provided in a region overlapping a region occupied by the first sealing layer 20a.

The connection portion 30 is provided at a position in a region where the first capacitance portion 14a and the second capacitance portion 14b face each other with the core portion interposed therebetween. The structure provided with the connection portion 30 has been described in the first embodiment.

The connection portion 30A is provided at a place where the second capacitance portion 14b is present but the first capacitance portion 14a is not present, i.e., at a position where the second solid electrolyte layer 13b and the core portion 11c overlap each other while not overlapping the first solid electrolyte layer 13a. This structure will be described as a second embodiment.

The connection portion 30B is provided at a place where the first capacitance portion 14a is present but the second capacitance portion 14b is not present, i.e., at a position where the first solid electrolyte layer 13a and the core portion 11c overlap each other while not overlapping the second solid electrolyte layer 13b. This structure will be described as a third embodiment.

The connection portion 30C is provided at a place where the first capacitance portion 14a and the second capacitance portion 14b are not present but the core portion 11c is present, i.e., at a position where the first solid electrolyte layer 13a and the second solid electrolyte layer 13b are not present but the core portion 11c is present. This structure will be described as a fourth embodiment.

The connection portion 30D is provided in a region where the exterior resin 100 is present. This structure will be described as a fifth embodiment.

The connection portion is only required to allow the second capacitance portion 14b to extend to a principal surface with the first capacitance portion 14a, and the connection portions 30, 30A, 30B, and 30C are not required to pass through the entire solid electrolytic capacitor.

Second Embodiment

The solid electrolytic capacitor according to the second embodiment of the present invention is provided with a capacitor element that includes a first sealing layer provided on the first conductor layer to seal a first principal surface of the capacitor element.

The connection portion is provided at a position where the second solid electrolyte layer and the core portion overlap each other while not overlapping the first solid electrolyte layer in top view. The connection portion also passes through at least the first sealing layer, the core portion, the second porous portion, and the second dielectric layer in their thickness directions to electrically connect the cathode external electrode and the second solid electrolyte layer.

The second embodiment enables an area of a second capacitance portion to be maximized, so that capacitance can be increased.

Figure 6:
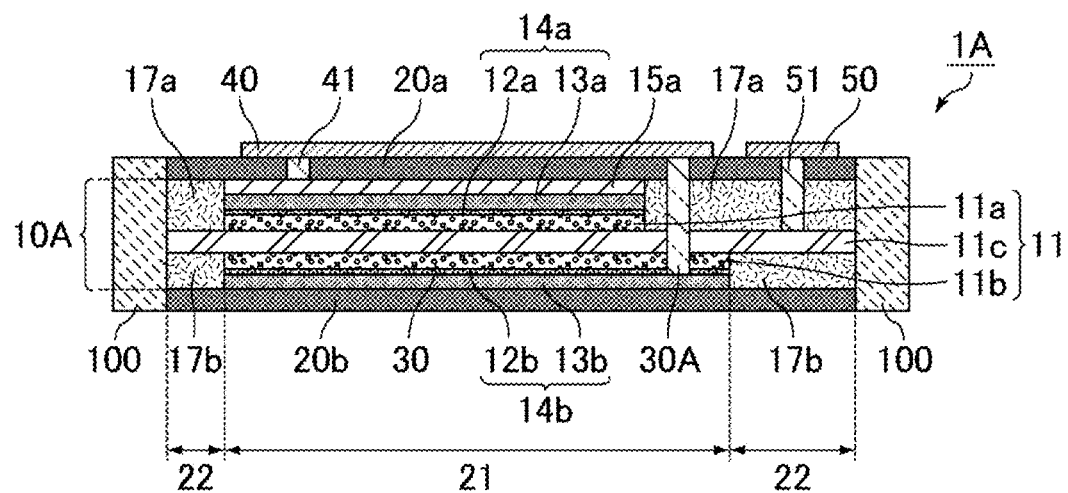
FIG. 6 is a sectional view schematically illustrating an example of a solid electrolytic capacitor according to a second embodiment of the present invention.

The solid electrolytic capacitor according to the second embodiment of the present invention will be described with reference to FIG. 6. FIG. 6 is a sectional view schematically illustrating one example of the solid electrolytic capacitor according to the second embodiment of the present invention.

FIG. 6 illustrates a solid electrolytic capacitor 1A in which a connection portion 30A is provided at a position where a second solid electrolyte layer 13b and a core portion 11c face each other, and where a first solid electrolyte layer 13a and the core portion 11c do not face each other. The capacitor element 10A provided with the connection portion 30A in such a place is configured such that the connection portion 30A passes through a first insulating layer 17a instead of passing through a first porous portion 11a, a first dielectric layer 12a, the first solid electrolyte layer 13a, and a first conductor layer 15a.

Thus, the connection portion passes through the first sealing layer 20a, the first insulating layer 17a, the core portion 11c, the second porous portion 11b, and the second dielectric layer 12b in their thickness directions to electrically connect the cathode external electrode 40 and the second solid electrolyte layer 13b.

Although not illustrated, the connection portion 30A and a valve action metal base 11 are insulated.

The solid electrolytic capacitor according to the second embodiment of the present invention includes the connection portion that electrically connects the cathode external electrode and the second solid electrolyte layer, so that it can be said that the second capacitance portion is extended to a principal surface with a first capacitance portion.

Although the connection portion 30A is connected to the cathode external electrode 40 in the solid electrolytic capacitor 1A illustrated in FIG. 6, the connection portion 30A may not be connected to the cathode external electrode 40.

When the connection portion 30A is not connected to the cathode external electrode 40, the connection portion 30A may be connected to another cathode-side external electrode (second cathode external electrode) insulated from the cathode external electrode 40, for example.

Third Embodiment

The solid electrolytic capacitor according to the third embodiment of the present invention is provided with a capacitor element that includes a second conductor layer provided on a second solid electrolyte layer, and a second sealing layer provided on the second conductor layer to seal a second principal surface of the capacitor element.

The connection portion is provided at a position where a first solid electrolyte layer and a core portion overlap each other while not overlapping the second solid electrolyte layer in top view, and the solid electrolytic capacitor further includes a back-surface extraction electrode layer provided on the second sealing layer. The back-surface extraction electrode layer is electrically connected to the second conductor layer through a back surface through electrode that passes through the second sealing layer. The connection portion passes at least a first dielectric layer, a first porous portion, the core portion, and second sealing layer in their thickness directions to electrically connect the first solid electrolyte layer and the back-surface extraction electrode layer.

The third embodiment enables an area of a first capacitance portion to be maximized, so that capacitance can be increased.

Figure 7:
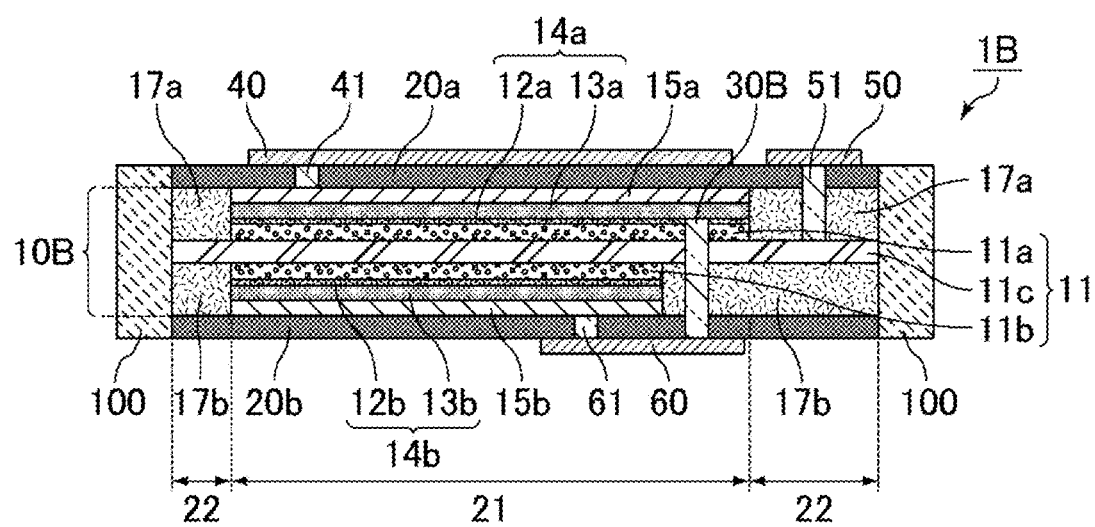
FIG. 7 is a sectional view schematically illustrating an example of a solid electrolytic capacitor according to a third embodiment of the present invention.

The solid electrolytic capacitor according to the third embodiment of the present invention will be described with reference to FIG. 7. FIG. 7 is a sectional view schematically illustrating one example of the solid electrolytic capacitor according to the third embodiment of the present invention.

FIG. 7 illustrates a solid electrolytic capacitor 1B in which a connection portion 30B is provided at a position where a first solid electrolyte layer 13a and a core portion 11c face each other, and where a second solid electrolyte layer 13b and the core portion 11c do not face each other. The capacitor element 10B provided with the connection portion 30B in such a place is configured such that the connection portion 30B passes through a second insulating layer 17b instead of passing through a second porous portion 11b, a second dielectric layer 12b, the second solid electrolyte layer 13b, and a second conductor layer 15b.

When a back-surface extraction electrode layer 60 is provided on a second sealing layer 20b, and is connected to a second conductor layer 15b through a back surface through electrode 61, the connection portion 30B passes through the first dielectric layer 12a, the first porous layer 11a, the core portion 11c, the second insulating layer 17b, and the second sealing layer 20b to electrically connect the first solid electrolyte layer 13a and the back-surface extraction electrode layer 60.

Although not illustrated, the connection portion 30B and a valve action metal base 11 are insulated.

The solid electrolytic capacitor according to the third embodiment of the present invention includes the connection portion that electrically connects the first solid electrolyte layer and the back-surface extraction electrode layer, so that it can be said that a second capacitance portion is extended to a principal surface with the first capacitance portion.

Fourth Embodiment

The solid electrolytic capacitor according to the fourth embodiment of the present invention is provided with a capacitor element that includes a first sealing layer provided on a first conductor layer to seal a first principal surface of the capacitor element, a second conductor layer provided on a second solid electrolyte layer, a second sealing layer provided on the second conductor layer to seal a second principal surface of the capacitor element, and a back-surface extraction electrode layer provided on the second sealing layer.

A connection portion is provided at a position where a first solid electrolyte layer and the second solid electrolyte layer are not present, and a core portion is present, in top view. The connection portion passes through at least the first sealing layer, the core portion, and the second sealing layer in their thickness direction to electrically connect a cathode external electrode and the back-surface extraction electrode layer.

In the fourth embodiment, an anode external electrode that is an external electrode, and a back-surface extraction electrode are directly connected by the connection portion. This reduces electric resistance when a second capacitance portion is extended to a principal surface with a first capacitance portion, so that ESR can be reduced.

Figure 8:
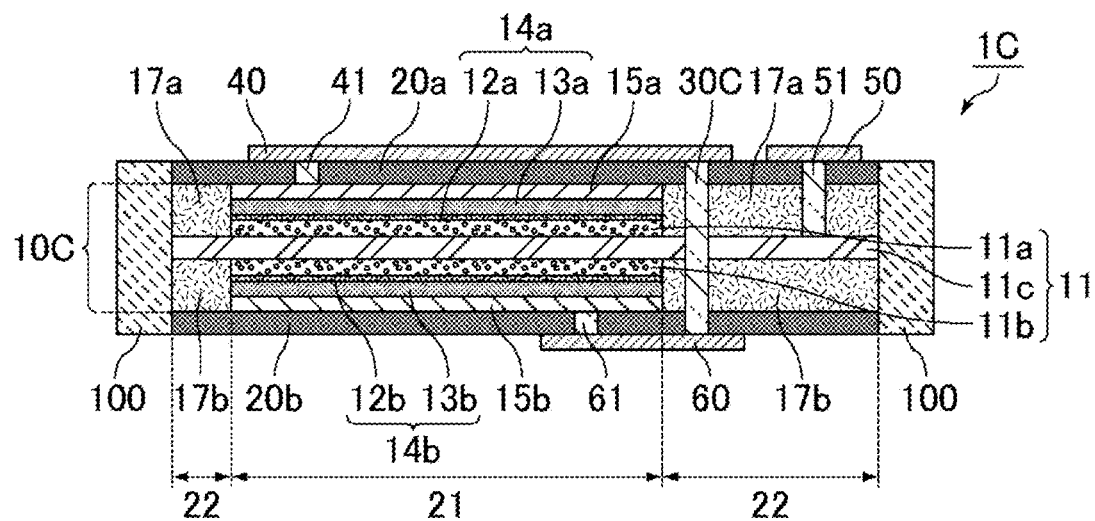
FIG. 8 is a sectional view schematically illustrating an example of a solid electrolytic capacitor according to a fourth embodiment of the present invention.

The solid electrolytic capacitor according to the fourth embodiment of the present invention will be described with reference to FIG. 8. FIG. 8 is a sectional view schematically illustrating one example of the solid electrolytic capacitor according to the fourth embodiment of the present invention.

FIG. 8 illustrates a solid electrolytic capacitor 1C in which a connection portion 30C is provided at a position where a second solid electrolyte layer 13b and a core portion 11c do not face each other, and where a first solid electrolyte layer 13a and the core portion 11c do not face each other. The capacitor element 10C including the connection portion 30C provided at such a place is configured such that the connection portion 30C passes through a first insulating layer 17a instead of a first porous portion 11a, a first dielectric layer 12a, the first solid electrolyte layer 13a, and a first conductor layer 15a, and passes through a second insulating layer 17b instead of a second porous portion 11b, a second dielectric layer 12b, the second solid electrolyte layer 13b, and a second conductive layer 15b.

When a back-surface extraction electrode layer 60 is provided on a second sealing layer 20b, and is connected to the second conductor layer 15b through a back surface through electrode 61, the connection portion 30C passes through a first sealing layer 20a, the first insulating layer 17a, the core portion 11c, the second insulating layer 17b, and the second sealing layer 20b in their thickness directions to electrically connect a cathode external electrode 40 and the back-surface extraction electrode layer 60.

Although not illustrated, the connection portion 30C and a valve action metal base 11 are insulated.

The solid electrolytic capacitor according to the fourth embodiment of the present invention is configured such that the connection portion 30C connects the cathode external electrode 40 and the back-surface extraction electrode layer 60, and the back-surface extraction electrode layer 60 is connected to the second conductor layer 15b and the second solid electrolyte layer 13b with the back surface through electrode 61 interposed therebetween. Thus, it can be said that the connection portion 30C extends a second capacitance portion 14b to a principal surface with a first capacitance portion 14a.

Although the connection portion 30C is connected to the cathode external electrode 40 in the solid electrolytic capacitor 1C illustrated in FIG. 8, the connection portion 30C may not be connected to the cathode external electrode 40.

When the connection portion 30C is not connected to the cathode external electrode 40, the connection portion 30C may be connected to another cathode-side external electrode (second cathode external electrode) insulated from the cathode external electrode 40, for example.

Fifth Embodiment

The solid electrolytic capacitor according to the fifth embodiment of the present invention is provided with a capacitor element that includes a first sealing layer provided on a first conductor layer to seal a first principal surface of the capacitor element, a second conductor layer provided on a second solid electrolyte layer, and a second sealing layer provided on the second conductor layer to seal a second principal surface of the capacitor element. The capacitor element further includes an exterior resin covering a side surface of the capacitor element and a back-surface extraction electrode layer provided on the second sealing layer.

The back-surface extraction electrode layer is electrically connected to the second conductor layer through a back surface through electrode passing through the second sealing layer. The back-surface extraction electrode layer is disposed extending from above the capacitor element onto the exterior resin in top view.

The back-surface extraction electrode layer is also extended to the principal surface with the first conductor layer by a connection portion passing through the exterior resin in its thickness direction.

The fifth embodiment includes the connection portion provided at a position where a first capacitance portion and a second capacitance portion do not overlap each other, so that capacitance can be increased by maximizing the first capacitance portion and the second capacitance portion.

Figure 9:
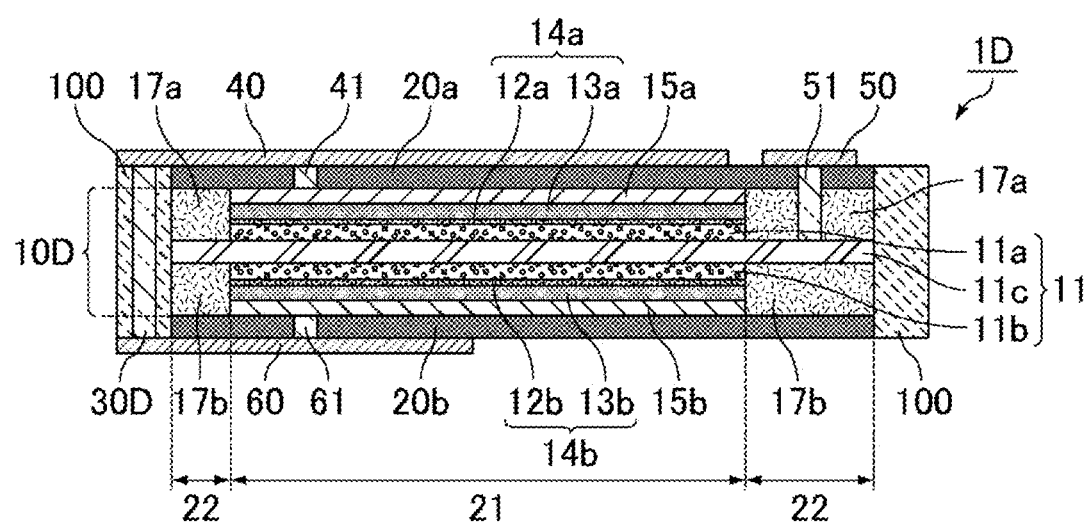
FIG. 9 is a sectional view schematically illustrating an example of a solid electrolytic capacitor according to a fifth embodiment of the present invention.

The solid electrolytic capacitor according to the fifth embodiment of the present invention will be described with reference to FIG. 9. FIG. 9 is a sectional view schematically illustrating one example of the solid electrolytic capacitor according to the fifth embodiment of the present invention.

FIG. 9 illustrates a solid electrolytic capacitor 1D that includes a capacitor element 10D and an exterior resin 100 disposed on a side surface of the capacitor element 10D. The exterior resin 100 constituting the solid electrolytic capacitor 1D is provided with a connection portion 30D. The solid electrolytic capacitor 1D includes a back-surface extraction electrode layer 60 extending from a portion on a second sealing layer 20b to a second principal surface of the exterior resin 100, and a cathode external electrode 40 extending from a portion on a first sealing layer 20a to a first principal surface of the exterior resin 100, which are electrically connected by the connection portion 30D passing through the exterior resin 100. The connection portion 30D does not pass through a valve action metal base 11, so that the connection portion 30D and the exterior resin 100 are not required to be insulated from each other.

The solid electrolytic capacitor according to the fifth embodiment of the present invention is configured such that the connection portion 30D connects the cathode external electrode 40 and the back-surface extraction electrode layer 60, and the back-surface extraction electrode layer 60 is connected to the second conductor layer 15b and the second solid electrolyte layer 13b with the back surface through electrode 61 interposed therebetween. Thus, it can be said that the connection portion 30D extends a second capacitance portion 14b to a principal surface with a first capacitance portion 14a.

Although the connection portion 30D is connected to the cathode external electrode 40 in the solid electrolytic capacitor 1D illustrated in FIG. 9, the connection portion 30D may not be connected to the cathode external electrode 40.

When the connection portion 30D is not connected to the cathode external electrode 40, the connection portion 30D may be connected to another cathode-side external electrode (second cathode external electrode) insulated from the cathode external electrode 40, for example.

(Method for Producing Solid Electrolytic Capacitor)

Examples of a method for producing a solid electrolytic capacitor of the present invention include, for example, a method including steps of: applying etching treatment to a first principal surface and a second principal surface of a valve action metal base serving as a core portion to form a first porous portion and a second porous portion, respectively; exposing the core portion by partly removing the first porous portion and the second porous portion; forming a first insulating layer and a second insulating layer on the core portion exposed; forming a through-hole passing through the core portion, the first porous portion, and the second porous portion; forming a first dielectric layer and a second dielectric layer on front surfaces of the first porous portion and the second porous portion, respectively, using chemical conversion treatment and forming a third dielectric layer on a front surface of the valve action metal base, exposed by the through-hole; applying solid electrolyte paste to front surfaces of the first dielectric layer and the second dielectric layer, and the inside of the through-hole to form a first solid electrolyte layer on the first dielectric layer, a second solid electrolyte layer on the second dielectric layer, and a connection portion inside the through-hole; forming a first conductor layer and a first sealing layer on the first solid electrolyte layer; forming a second sealing layer on the second solid electrolyte layer; forming a cathode through-hole in first surface of the first sealing layer to expose the first conductor layer; forming an anode through-hole in the first insulating layer to expose the core portion; forming a cathode through electrode in the cathode through-hole; forming an anode through electrode in the anode through-hole; forming a cathode external electrode on the cathode through electrode; and forming an anode external electrode on the anode through electrode. Using such a method enables the solid electrolytic capacitor according to the first embodiment of the present invention to be obtained, for example.

The method may include the step of partly insulating the first porous portion and the second porous portion to form the first insulating layer and the second insulating layer on the core portion without exposing the core portion, instead of the two steps of: exposing the core portion by partly removing the first porous portion and the second porous portion; and forming the first insulating layer and the second insulating layer on the core portion exposed.

Examples of a method for insulating the first porous portion and the second porous portion include a method for impregnating the front surfaces of the first porous portion and the second porous portion with insulating ink.

An example of a method for producing the solid electrolytic capacitor of the present invention will be described with reference to FIGS. 10(a) to 10(f), and 11(a) to 11(d).

FIGS. 10(a) to 10(f), and 11(a) to 11(d) are diagrams schematically illustrating an example of a method for producing the solid electrolytic capacitor of the present invention.

Figure 10A:
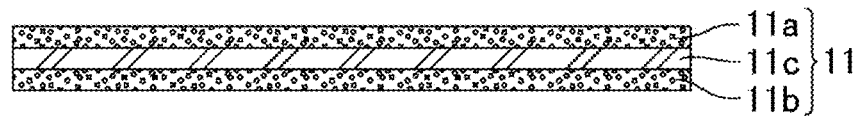
FIGS. 10(a) to 10(f) are diagrams schematically illustrating an example of a method for producing a solid electrolytic capacitor of the present invention.

As illustrated in FIG. 10(a), first, a valve action metal base 11 is prepared by applying etching treatment to both sides thereof to form a first porous portion 11a and a second porous portion 11b, respectively. The valve action metal base 11 includes a portion without being subjected to the etching treatment, serving as a core portion 11c.

When aluminum foil is used as the valve action metal base, for example, the dielectric layer composed of an oxide film can be formed by performing anodizing (also called chemical conversion treatment) on a surface of the aluminum foil in an aqueous solution containing ammonium adipate and the like.

Figure 10B:
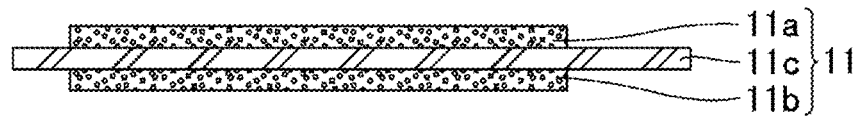

Subsequently, as illustrated in FIG. 10(b), the valve action metal base 11 is subjected to laser treatment or the like to partly remove the first porous portion 11a and the second porous portion 11b.

In the step of exposing the core portion by removing the porous portion using laser treatment or the like, the dielectric layer formed on the porous portion can also be removed by adjusting conditions such as laser irradiation intensity.

Thus, after the dielectric layer is formed on a front surface of the porous portion, a part of the core portion may be exposed by laser treatment or the like.

From a viewpoint of enhancing production efficiency, conversion foil having been preliminarily subjected to etching treatment and chemical conversion treatment may be used as the valve action metal base provided on its front surface with the porous portion and the dielectric layer. In this case, the porous portion and the dielectric layer are formed on the entire conversion foil, so that the core portion to be an anode portion can be exposed on the front surface of the valve action metal base by partly removing the dielectric layer and the porous portion using laser treatment or the like.

Figure 10C:
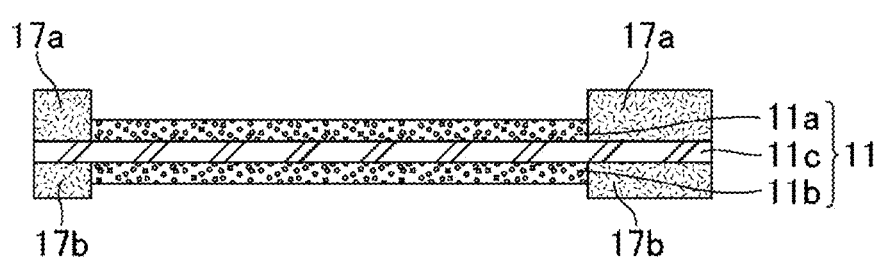

Subsequently, as illustrated in FIG. 10(c), a first insulating layer 17a and a second insulating layer 17b are each formed covering an exposed surface of the core portion 11c.

Examples of a method for forming the insulating layer include a method for applying an insulating resin to the surface of the core portion 11c. The method for applying an insulating resin is not particularly limited, and examples thereof include a method using a dispenser, and screen printing.

In place of the steps illustrated in FIGS. 10(b) and 10(c), the method may include the step of directly forming the first insulating layer 17a and the second insulating layer 17b by partly insulating the first porous portion 11a and the second porous portion 11b.

In this case, for example, when insulating ink is partly impregnated into the first porous portion 11a and the second porous portion 11b, the first porous portion 11a can be partly changed to the first insulating layer 17a, and the second porous portion 11b can be partly changed to the second insulating layer 17b.

Figure 10D:
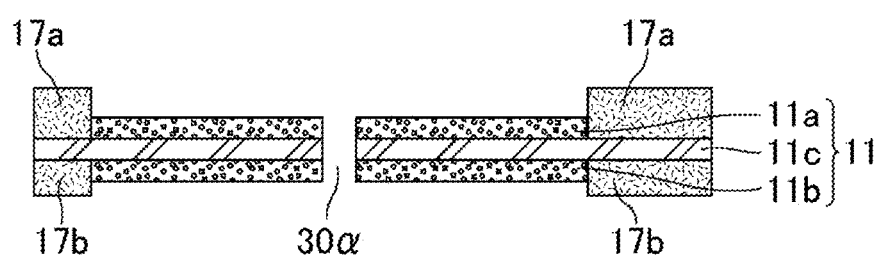

Subsequently, as illustrated in FIG. 10(d), a through-hole 30a passing through the first porous portion 11a, the second porous portion 11b, and the core portion 11c is formed.

Examples of a method for forming the through-hole 30α include laser processing, punching, cutting with a drill, and the like.

Figure 10E:
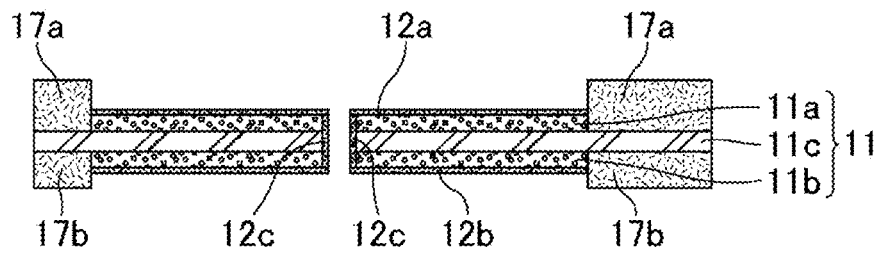

Subsequently, as illustrated in FIG. 10(e), chemical conversion treatment is applied to front surfaces of the first porous portion 11a and the second porous portion 11b and a surface of the core portion 11c, exposed by forming the through-hole 30a, to form a first dielectric layer 12a, a second dielectric layer 12b, and a third dielectric layer 12c.

Figure 10F:
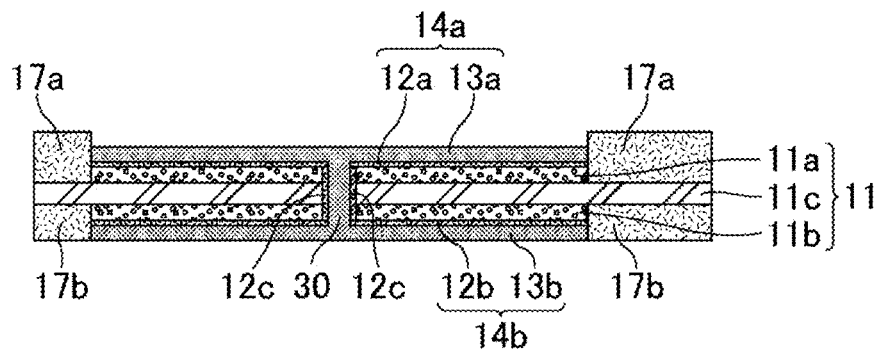

Subsequently, as illustrated in FIG. 10(f), paste containing a conductive polymer (conductive polymer paste) is applied to the surfaces of the first dielectric layer 12a and the second dielectric layer 12b and filled into the through-hole 30a to form a first solid electrolyte layer 13a, a second solid electrolyte layer 13b, and a connection portion 30.

The first solid electrolyte layer 13a is formed on the first dielectric layer 12a to form a first capacitance portion 14a. The second solid electrolyte layer 13b is formed on the second dielectric layer 12b to form a second capacitance portion 14b.

Examples of a method for forming a solid electrolyte layer includes a method for forming a polymerized film such as poly (3,4-ethylenedioxythiophene) on a surface of the dielectric layer using a treatment liquid containing a monomer such as 3,4-ethylenedioxythiophene, a method for applying a dispersion liquid of a polymer such as poly (3,4-ethylenedioxythiophene) on the surface of the dielectric layer and drying the dispersion liquid, and the like. These methods enable the solid electrolyte layer to be formed. The solid electrolyte layer is preferably formed such that an inner layer for filling pores of the dielectric layer is formed and then an outer layer for covering the dielectric layer is formed.

Figure 11A:
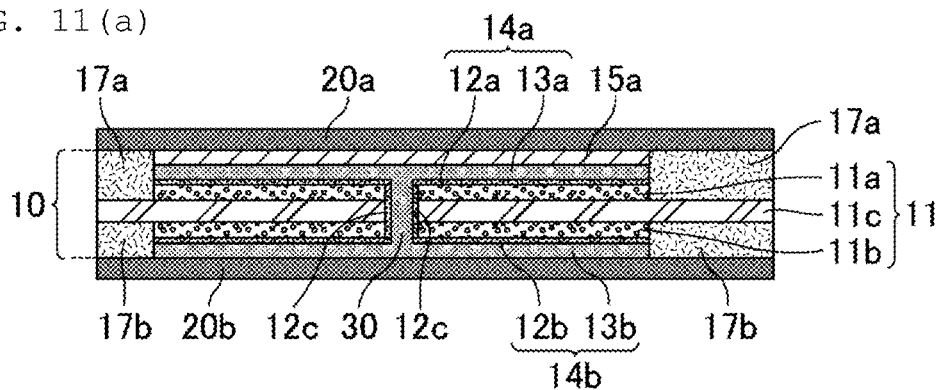
FIGS. 11(a) to 11(d) are diagrams schematically illustrating an example of a method for producing a solid electrolytic capacitor of the present invention.

Subsequently, as illustrated in FIG. 11(a), a first conductor layer 15a is formed on the first solid electrolyte layer 13a, and a first sealing layer 20a is formed on the first conductor layer 15a and the first insulating layer 17a. Additionally, a second sealing layer 20b is formed on the second solid electrolyte layer 13b and the second insulating layer 17b.

The second conductor layer 15b may be formed on the second solid electrolyte layer 13b, and then the second sealing layer 20b may be formed on the second conductor layer 15b.

Examples of a method for forming a conductor layer include a method for providing metal foil on a solid electrolyte layer and a method for providing a conductive resin layer such as a carbon layer. Instead of the conductive resin layer, a silver layer may be used, or the silver layer may be provided between conductive resin and metal foil.

For example, the carbon layer and the silver layer can be formed such that carbon paste is applied and dried, and then silver paste is applied and dried.

When metal foil is provided, the metal foil is preferably placed in a state where a layer located under the metal foil is viscous. The carbon paste, the silver paste, and the solid electrolyte layer, before being dried, are viscous and are suitable for directly placing the metal foil thereon. In contrast, when the carbon layer, the silver layer, or the solid electrolyte layer, as a layer located under the metal foil, is dried, the metal foil is difficult to be bonded, and thus the metal foil is preferably placed after a conductive adhesive layer is provided.

For example, the sealing layer can be formed by a molding resin molding method or the like. The sealing layer may be formed only on the conductor layer or may be formed on the insulating layer adjacent to the conductor layer.

Figure 11B:
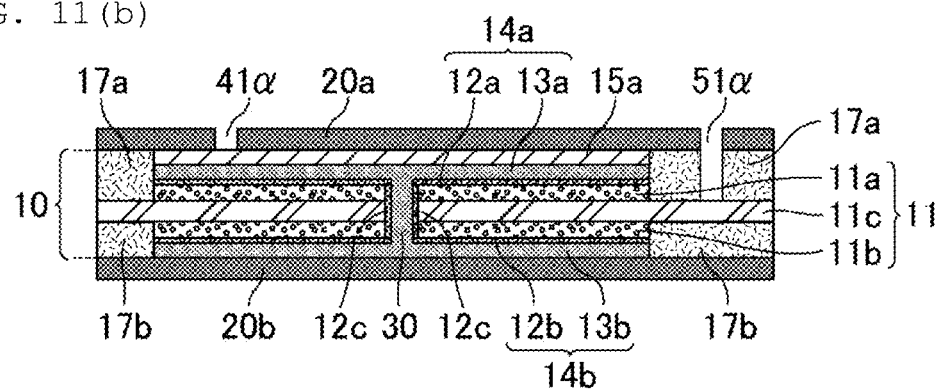

Subsequently, as illustrated in FIG. 11(b), a cathode through-hole 41α passing through the first sealing layer 20a and an anode through-hole 51α passing through the first insulating layer 17a are formed.

A method for forming the cathode through-hole 41α and the anode through-hole 51α is not particularly limited, and laser processing or the like can be used.

Figure 11C:
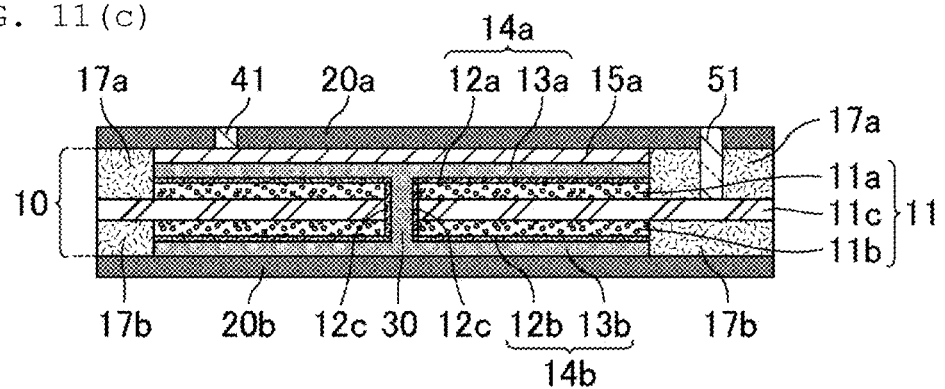

Subsequently, as illustrated in FIG. 11(c), a cathode through electrode 41 and an anode through electrode 51 are formed in the cathode through-hole 41α and the anode through-hole 51α, respectively.

Examples of a method for forming the cathode through electrode 41 and the anode through electrode 51 include a method for filling the cathode through-hole or the anode through-hole using a method such as plating, sputtering, or vapor deposition, and a method for filling the cathode through-hole or the anode through-hole with conductive paste. The cathode through electrode and the anode through electrode each have a shape that is not limited to a cylindrical columnar shape, and that may be a wall shape.

Figure 11D:
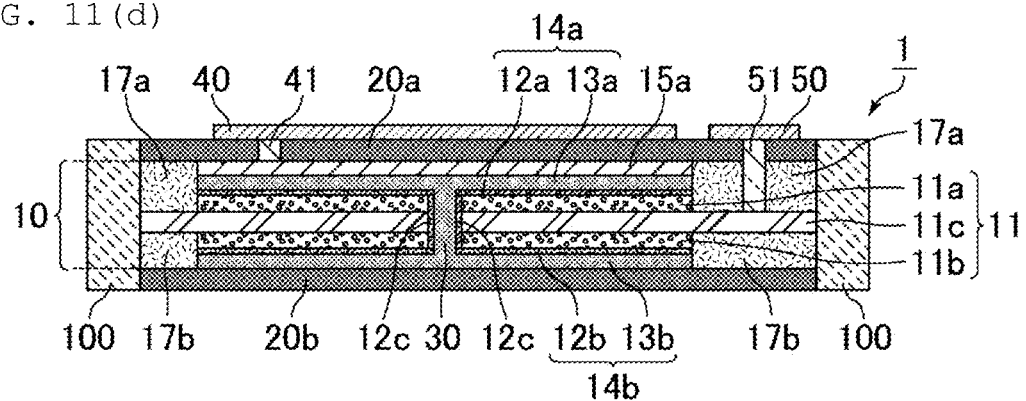

Finally, as illustrated in FIG. 11(d), the cathode external electrode 40 is formed on the cathode through electrode 41, and the anode external electrode 50 is formed on the anode through electrode 51.

Examples of a method for forming the cathode external electrode and the anode external electrode include plating, sputtering, vapor deposition, and application of conductive paste. The method may be a method for forming a terminal in the shape of a ball on each of the cathode through electrode and the anode through electrode. The above procedure enables obtaining a solid electrolytic capacitor 1 that is one embodiment of the solid electrolytic capacitor of the present invention.

The cathode through electrode and the anode through electrode may be formed after the first sealing layer is formed, or may be formed before the first sealing layer is formed.

The solid electrolytic capacitor and the method for producing the same according to the present invention are not limited to the above embodiments, and various applications and modifications can be added for structure, production conditions, and the like, of the solid electrolytic capacitor, within the scope of the present invention.

The cathode through electrode and the cathode external electrode are preferably made of plating layers identical in composition, cured products of conductive paste identical in composition, or solder compounds identical in composition. The anode through electrode and the anode external electrode are preferably made of plating layers identical in composition, cured products of conductive paste identical in composition, or solder compounds identical in composition.

When the cathode through electrode and the anode through electrode, and the cathode external electrode and the anode external electrode, are made of materials identical in kind (a plating film, a cured product of conductive paste, a solder compound, or the like), resistance in a path therethrough can be further reduced.

The anode through electrode and the anode external electrode are preferably integrally formed. In the present specification, the text, "the anode through electrode and the anode external electrode are integrally formed", means that there is not another connection layer made of a conductive adhesive, solder, or the like between the anode through electrode and the anode external electrode.

The cathode through electrode and the cathode external electrode are preferably integrally formed. In the present specification, the text, "the cathode through electrode and the cathode external electrode are integrally formed", means that there is not another connection layer made of a conductive adhesive, solder, or the like between the cathode through electrode and the cathode external electrode.

The method for producing the solid electrolytic capacitor of the present invention may further includes the step of forming the second conductor layer on the second solid electrolyte layer.

When the step of forming the second conductor layer is performed, the method may further include the steps of: forming a back-surface extraction electrode layer on the second sealing layer; and forming a back surface through electrode connecting the second conductor layer and the back-surface extraction electrode layer in the second sealing layer.

The step of forming the second conductor layer can use a method as in the step of forming the first conductor layer.

Forming the back-surface extraction electrode layer and forming the back surface through electrode connecting the back-surface extraction electrode layer to the second conductor layer can use a method similar to the method for forming the cathode external electrode and the method for forming the cathode through electrode, described above.

The back surface through electrode and the back-surface extraction electrode layer are preferably integrally formed.

In the present specification, the text, "the back surface through electrode and the back-surface extraction electrode layer are integrally formed", means that there is not another connection layer made of a conductive adhesive, solder, or the like between the back surface through electrode and the back-surface extraction electrode layer.

The method for producing the solid electrolytic capacitor of the present invention allows appropriately adjusting timing of performing the step of forming each of the through-holes depending on a position where each of the through-holes is to be disposed and types and the number of layers through which the corresponding through-holes pass. For example, although in FIGS. 10(a) to 10(f) and FIGS. 11(a) to 11(d), the through-holes are formed before the solid electrolyte layer is formed, the through-holes may be formed after the solid electrolyte layer is formed, or the through-holes may be formed after the sealing layer is formed.

However, when the corresponding through-holes pass through the valve action metal base, the valve action metal base is required to be insulated from the connection portion.

Another example of the method for producing the solid electrolytic capacitor of the present invention will be described.

For example, a method will be described in which the connection portion is provided at a position where the second solid electrolyte layer and the core portion overlap each other in top view while not overlapping the first solid electrolyte layer, and the connection portion passes through the first sealing layer, the first insulating layer, the core portion, the second porous portion, and the second dielectric layer, in their thickness directions.

In this method, first, in the step illustrated in FIG. 10 (b), an area of an exposed portion on a first principal surface of the core portion is changed from that on a second principal surface thereof to increase an area of the second porous portion to more than an area of the first porous portion. Then, without performing the step illustrated in FIG. 10(d) (the step of forming a through-hole), the first dielectric layer, the second dielectric layer, the first solid electrolyte layer, the second solid electrolyte layer, the first conductor layer, the first sealing layer, and the second sealing layer are formed.

After that, a through-hole passing through from the first sealing layer to the second dielectric layer is formed at a position where the second solid electrolyte layer and the core portion overlap each other in top view while not overlapping the first solid electrolyte layer, i.e., at a position where the first insulating layer, the core portion, and the second solid electrolyte layer face each other.

Then, an insulating film made of an insulating resin is formed on at least a surface of the through-hole, corresponding to the core portion and the second porous portion.

After that, a plating electrode or a paste electrode is formed in the through-hole to form a connection portion passing through the first sealing layer, the first insulating layer, the core portion, the second porous portion, and the second dielectric layer.

Such a method enables obtaining the solid electrolytic capacitor according to the second embodiment of the present invention.

Subsequently, for example, a method will be described in which the connection portion is provided at a position where the first solid electrolyte layer and the core portion overlap each other in top view while not overlapping the second solid electrolyte layer, and the connection portion passes through the first dielectric layer, the first porous portion, the core portion, the second insulating layer, and the second sealing layer, in their thickness directions.

In this method, in the step illustrated in FIG. 10(b), an area of an exposed portion on a first principal surface of the core portion is changed from that on a second principal surface thereof to increase an area of the first porous portion to more than an area of the second porous portion.

Then, without performing the step illustrated in FIG. 10(d) (the step of forming a through-hole), the first dielectric layer, the second dielectric layer, the first solid electrolyte layer, the second solid electrolyte layer, the first conductor layer, the second conductor layer, the first sealing layer, and the second sealing layer are formed. At this time, the second conductor layer is formed on the second solid electrolyte layer, and then the second sealing layer is formed on the second conductor layer.

Then, in the step illustrated in FIG. 11(b), a back surface through-hole is formed in the second sealing layer by a method similar to that for forming the cathode through hole 41α in the first sealing layer.

Subsequently, a through-hole passing through from a second sealing layer side to the first dielectric layer is formed at a position where the first solid electrolyte layer, the core portion, and the second insulating layer are present in top view.

Then, an insulating film made of an insulating resin is formed on at least a surface of the through-hole, corresponding to the first porous portion and the core portion. After that, plating electrodes or paste electrodes are formed in the through-hole and the back surface through-hole to form a connection portion passing through the first dielectric layer, the first porous portion, the core portion, the second insulating layer, and the second sealing layer, and a back surface through electrode passing through the second sealing layer, respectively. Finally, a back-surface extraction electrode layer is formed covering an upper portion of the connection portion and an upper portion of the back surface through electrode.

Such a method enables obtaining the solid electrolytic capacitor according to the third embodiment of the present invention.

Subsequently, for example, a method will be described in which the connection portion is provided at a position where the first solid electrolyte layer 13a and the second solid electrolyte layer 13b are not present and the core portion 11c is present, and the connection portion passes through the first sealing layer, the first insulating layer, the core portion, the second insulating layer, and the second sealing layer, in their thickness directions.

In this method, without performing the step illustrated in FIG. 10(d), the first dielectric layer, the second dielectric layer, the first solid electrolyte layer, the second solid electrolyte layer, the first conductor layer, the second conductor layer, the first sealing layer, and the second sealing layer are formed. At this time, the second conductor layer is formed on the second solid electrolyte layer, and then the second sealing layer is formed on the second conductor layer. Then, in the step illustrated in FIG. 11(b), through-holes are formed at positions where the first sealing layer, the first insulating layer, the core portion, the second insulating layer, and the second sealing layer overlap each other.

Subsequently, the back surface through-hole passing through the second sealing layer is formed. After that, an insulating film made of an insulating resin is formed on at least a surface of the through-hole, corresponding to the core portion.

Then, plating electrodes or paste electrodes are formed in the through-hole and the back surface through-hole to form a connection portion passing through the first sealing layer, the first insulating layer, the core portion, the second insulating layer, and the second sealing layer, and a back surface through electrode passing through the second sealing layer, respectively. Finally, a back-surface extraction electrode layer is formed covering an upper portion of the connection portion and an upper portion of the back surface through electrode.

Such a method enables obtaining the solid electrolytic capacitor according to the fourth embodiment of the present invention.

Subsequently, for example, a method will be described in which the connection portion passes through the exterior resin covering the side surface of the capacitor element.

In this method, without performing the step illustrated in FIG. 10(d) (the step of forming a through-hole), the first dielectric layer, the second dielectric layer, the first solid electrolyte layer, the second solid electrolyte layer, the first conductor layer, the second conductor layer, the first sealing layer, and the second sealing layer are formed to obtain the capacitor element. At this time, the second conductor layer is formed on the second solid electrolyte layer, and then the second sealing layer is formed on the second conductor layer. After that, the exterior resin is provided on the side surface of the capacitor element. Then, in the step illustrated in FIG. 11(b), a through-hole passing through the exterior resin in its thickness direction is formed in addition to the cathode through-hole passing through the first sealing layer, the anode through-hole passing through the first insulating layer and the first sealing layer, and the back surface through-hole passing through the second sealing layer.

Subsequently, plating electrodes or paste electrodes are formed in these respective through-holes to form the cathode through electrode, the anode through electrode, the back surface through electrode, and the connection portion.

Finally, the cathode external electrode is formed covering the cathode through electrode exposed on the first sealing layer and the connection portion exposed on the first sealing layer side of the exterior resin, and the back-surface extraction electrode layer is formed covering the back surface through electrode exposed on the second sealing layer and the connection portion exposed on the second sealing layer side of the exterior resin.

Such a method enables obtaining the solid electrolytic capacitor according to the fifth embodiment of the present invention.

For example, although in the method for producing the solid electrolytic capacitor described above, the method for producing one solid electrolytic capacitor is described, a plurality of solid electrolytic capacitors may be produced and then may be separated into individual pieces.

When the solid electrolytic capacitor of the present invention includes the insulating layer provided between the core portion provided with no porous portion and the sealing layer, the conductor layer may be provided on the insulating layer or may not be provided on the insulating layer, but is preferably provided on the insulating layer. When the conductor layer is also provided on the insulating layer, a portion allowing the cathode through electrode grounded to the cathode external electrode to be installed is increased in area, and thus enabling reduction in ESR.

DESCRIPTION OF REFERENCE SYMBOLS 1, 2, 3, 1A, 1B, 1C, 1D: solid electrolytic capacitor
10, 101, 102, 10A, 10B, 10C, 10D: capacitor element
11: valve action metal base
11a: first porous portion
11b: second porous portion
11c: core portion
12a: first dielectric layer 12b: second dielectric layer
12c: third dielectric layer
13a: first solid electrolyte layer
13b: second solid electrolyte layer
14a: first capacitance portion
14b: second capacitance portion
15a: first conductor layer
15b: second conductor layer
17a: first insulating layer
17b: second insulating layer
17c: insulating film
20a: first sealing layer
20b: second sealing layer
21: cathode portion
22: anode portion
30, 301, 31, 30A, 30B, 30C, 30D: connection portion
30α: through-hole
32: first non-through-hole
33: second non-through-hole
40: cathode external electrode
41: cathode through electrode
41α: cathode through-hole
50: anode external electrode
51: anode through electrode
51α: anode through-hole
60: back-surface extraction electrode layer
61: back surface through electrode
100: exterior resin

The invention claimed is:

1. A solid electrolytic capacitor comprising:
   a capacitor element including:
      a valve action metal base with a core portion having a first principal surface and a second principal surface, a first porous portion on the first principal surface and a second porous portion on the second principal surface;
      a first dielectric layer on the first porous portion;
      a first solid electrolyte layer on the first dielectric layer;
      a first conductor layer on the first solid electrolyte layer;
      a second dielectric layer on the second porous portion; and
      a second solid electrolyte layer on the second dielectric layer,
      the first dielectric layer and the first solid electrolyte layer forming a first capacitance portion at a principal surface of the solid electrolytic capacitor, and
      the second dielectric layer and the second solid electrolyte layer forming a second capacitance portion;
   a cathode external electrode electrically connected to the first conductor layer;
   an anode external electrode electrically connected to the core portion;
   a cathode through electrode electrically connecting the first capacitance portion to the cathode external electrode; and
   a connection portion passing through at least a part of the solid electrolytic capacitor in a thickness direction thereof so as to extend the second capacitance portion to the principal surface of the solid electrolytic capacitor having the first capacitance portion, wherein
   the capacitor element further includes a sealing layer on the first conductor layer which seals a main surface of the capacitor element,
   the connection portion is at a position where the second solid electrolyte layer and the core portion overlap each other while not overlapping the first solid electrolyte layer in a top view of the solid electrolytic capacitor, and
   the connection portion passes through at least the first sealing layer, the core portion, the second porous portion, and the second dielectric layer, in their respective thickness directions to electrically connect the cathode external electrode and the second solid electrolyte layer.

2. The solid electrolytic capacitor according to claim 1, wherein
   the connection portion is at a position where the first solid electrolyte layer, the core portion, and the second solid electrolyte layer overlap each other in a top view of the solid electrolytic capacitor, and
   the connection portion passes through at least the first dielectric layer, the first porous portion, the core portion, the second porous portion, and the second dielectric layer in their respective thickness directions to electrically connect the first solid electrolyte layer and the second solid electrolyte layer.

3. The solid electrolytic capacitor according to claim 1, wherein the connection portion has a cylindrical columnar shape.

4. The solid electrolytic capacitor according to claim 1, wherein the connection portion has a bent shape in which first and second openings are displaced from each other in a top view of the solid electrolytic capacitor.

5. A solid electrolytic capacitor comprising:
   a capacitor element including:
      a valve action metal base with a core portion having a first principal surface and a second principal surface, a first porous portion on the first principal surface and a second porous portion on the second principal surface;
      a first dielectric layer on the first porous portion;
      a first solid electrolyte layer on the first dielectric layer;
      a first conductor layer on the first solid electrolyte layer;
      a second dielectric layer on the second porous portion; and
      a second solid electrolyte layer on the second dielectric layer,
      the first dielectric layer and the first solid electrolyte layer forming a first capacitance portion at a principal surface of the solid electrolytic capacitor, and
      the second dielectric layer and the second solid electrolyte layer forming a second capacitance portion;
   a cathode external electrode electrically connected to the first conductor layer;
   an anode external electrode electrically connected to the core portion;
   a cathode through electrode electrically connecting the first capacitance portion to the cathode external electrode; and
   a connection portion passing through at least a part of the solid electrolytic capacitor in a thickness direction thereof so as to extend the second capacitance portion to the principal surface of the solid electrolytic capacitor having the first capacitance portion, wherein
   the capacitor element further includes a second conductor layer on the second solid electrolyte layer, and a sealing layer on the second conductor layer which seals a main surface of the capacitor element,
   the connection portion is at a position where the first solid electrolyte layer and the core portion overlap each other while not overlapping the second solid electrolyte layer in a top view of the solid electrolytic capacitor, and the solid electrolytic capacitor further includes:
a back-surface extraction electrode layer on the second sealing layer; and
a back surface through electrode passing through the second sealing layer and electrically connecting the back-surface extraction electrode layer to the second conductor layer, wherein
the connection portion passes through at least the first dielectric layer, the first porous portion, the core portion, and the second sealing layer, in their respective thickness directions to electrically connect the first solid electrolyte layer and the back-surface extraction electrode layer.

6. The solid electrolytic capacitor according to claim 5, wherein
the connection portion is at a position where the first solid electrolyte layer, the core portion, and the second solid electrolyte layer overlap each other in a top view of the solid electrolytic capacitor, and
the connection portion passes through at least the first dielectric layer, the first porous portion, the core portion, the second porous portion, and the second dielectric layer in their respective thickness directions to electrically connect the first solid electrolyte layer and the second solid electrolyte layer.

7. The solid electrolytic capacitor according to claim 5, wherein the connection portion has a cylindrical columnar shape.

8. The solid electrolytic capacitor according to claim 5, wherein the connection portion has a bent shape in which first and second openings are displaced from each other in a top view of the solid electrolytic capacitor.

9. A solid electrolytic capacitor comprising:
a capacitor element including:
a valve action metal base with a core portion having a first principal surface and a second principal surface, a first porous portion on the first principal surface and a second porous portion on the second principal surface;
a first dielectric layer on the first porous portion;
a first solid electrolyte layer on the first dielectric layer;
a first conductor layer on the first solid electrolyte layer;
a second dielectric layer on the second porous portion; and
a second solid electrolyte layer on the second dielectric layer,
the first dielectric layer and the first solid electrolyte layer forming a first capacitance portion at a principal surface of the solid electrolytic capacitor, and
the second dielectric layer and the second solid electrolyte layer forming a second capacitance portion;
a cathode external electrode electrically connected to the first conductor layer;
an anode external electrode electrically connected to the core portion;
a cathode through electrode electrically connecting the first capacitance portion to the cathode external electrode; and
a connection portion directly connected to the first and second solid electrolyte layers and passing through at least a part of the solid electrolytic capacitor in a thickness direction thereof so as to extend the second capacitance portion to the principal surface of the solid electrolytic capacitor having the first capacitance portion, wherein
the capacitor element further includes a first sealing layer on the first conductor layer which seals a first main surface of the capacitor element, a second conductor layer on the second solid electrolyte layer, and a second sealing layer on the second conductor layer which seals a second main surface of the capacitor element, and
the solid electrolytic capacitor further includes a back-surface extraction electrode layer on the second sealing layer,
the connection portion is at a position where the first solid electrolyte layer and the second solid electrolyte layer are not present and the core portion is present in a top view of the solid electrolytic capacitor, and
the connection portion passes through at least the first sealing layer, the core portion, and the second sealing layer in their respective thickness directions to electrically connect the cathode external electrode and the back-surface extraction electrode layer.

10. The solid electrolytic capacitor according to claim 9, wherein the connection portion has a cylindrical columnar shape.

11. A solid electrolytic capacitor comprising:
a capacitor element including:
a valve action metal base with a core portion having a first principal surface and a second principal surface, a first porous portion on the first principal surface and a second porous portion on the second principal surface;
a first dielectric layer on the first porous portion;
a first solid electrolyte layer on the first dielectric layer;
a first conductor layer on the first solid electrolyte layer;
a second dielectric layer on the second porous portion; and
a second solid electrolyte layer on the second dielectric layer,
the first dielectric layer and the first solid electrolyte layer forming a first capacitance portion at a principal surface of the solid electrolytic capacitor, and
the second dielectric layer and the second solid electrolyte layer forming a second capacitance portion;
a cathode external electrode electrically connected to the first conductor layer;
an anode external electrode electrically connected to the core portion;
a cathode through electrode electrically connecting the first capacitance portion to the cathode external electrode; and
a connection portion passing through at least a part of the solid electrolytic capacitor in a thickness direction thereof so as to extend the second capacitance portion to the principal surface of the solid electrolytic capacitor having the first capacitance portion, wherein
the capacitor element further includes a first sealing layer on the first conductor layer which seals a first main surface of the capacitor element, a second conductor layer on the second solid electrolyte layer, and a second sealing layer on the second conductor layer which seals a second main surface of the capacitor element,
the solid electrolytic capacitor further includes:
an exterior resin covering a side surface of the capacitor element; and
a back-surface extraction electrode layer on the second sealing layer;

a back surface through electrode passing through the second sealing layer and electrically connecting the back-surface extraction electrode layer to the second conductor layer, wherein the back-surface extraction electrode layer extends from a portion on the capacitor element to the exterior resin in a top view of the solid electrolytic capacitor, and the connection portion passes through the exterior resin in a thickness direction thereof so as to electrically connect the back-surface extraction electrode layer to the cathode external electrode.

12. The solid electrolytic capacitor according to claim 11, wherein the connection portion is at a position where the first solid electrolyte layer, the core portion, and the second solid electrolyte layer overlap each other in a top view of the solid electrolytic capacitor, and the connection portion passes through at least the first dielectric layer, the first porous portion, the core portion, the second porous portion, and the second dielectric layer in their respective thickness directions to electrically connect the first solid electrolyte layer and the second solid electrolyte layer.

13. The solid electrolytic capacitor according to claim 11, wherein the connection portion has a cylindrical columnar shape.

14. The solid electrolytic capacitor according to claim 11, wherein the connection portion has a bent shape in which first and second openings are displaced from each other in a top view of the solid electrolytic capacitor.

* * * * *